United States Patent

Konda et al.

Patent Number: 5,254,201
Date of Patent: Oct. 19, 1993

[54] METHOD OF STRIPPING OFF WAFER-PROTECTIVE SHEET

[75] Inventors: Yukari Konda; Eiji Shigemura; Yutaka Kuwabara; Shoji Yamamoto; Tatuya Kubozono, all of Osaka, Japan

[73] Assignee: Nitto Denko Corporation, Osaka, Japan

[21] Appl. No.: 824,564

[22] Filed: Jan. 23, 1992

[51] Int. Cl.$^5$ .............................................. B32B 35/00
[52] U.S. Cl. ......................................... 156/344; 156/584
[58] Field of Search ........................ 156/247, 344, 584

[56] References Cited

U.S. PATENT DOCUMENTS

| | | | |
|---|---|---|---|
| 4,111,724 | 9/1978 | Ogiue et al. | 156/643 X |
| 4,285,759 | 8/1981 | Allen et al. | 156/344 X |
| 4,631,103 | 12/1986 | Ametani | 156/344 X |
| 4,775,438 | 10/1988 | Funakoshi et al. | 156/344 X |
| 4,861,411 | 8/1989 | Tezuka | 156/584 X |
| 5,006,190 | 4/1991 | Earle | 156/344 X |
| 5,009,735 | 4/1991 | Ametani et al. | 156/344 X |

FOREIGN PATENT DOCUMENTS 0085745  4/1991  Japan ..................... 156/344

Primary Examiner—David A. Simmons
Assistant Examiner—Mark A. Osele
Attorney, Agent, or Firm—Sughrue, Mion, Zinn, Macpeak & Seas

[57] ABSTRACT

A method of stripping off a wafer-protective sheet which comprises bonding an electrically conductive continuousform stripping tape comprising a flexible substrate to, through a pressure-sensitive adhesive layer, an electrically conductive protective sheet applied to a semiconductor wafer on its side where a circuit pattern has been formed, and then peeling the stripping tape from the semiconductor wafer thereby to strip the protective sheet from the semiconductor wafer, said bonding and peeling of the stripping tape being conducted automatically by means of an automatic stripping system while the protective sheet is kept being grounded through the stripping tape.

4 Claims, 1 Drawing Sheet

METHOD OF STRIPPING OFF WAFER-PROTECTIVE SHEET

FIELD OF THE INVENTION

The present invention relates to a method of stripping off an electrically conductive protective sheet applied to a semiconductor wafer on its side where a circuit pattern has been formed (hereinafter often referred to as "circuit pattern side"), while the protective sheet is kept grounded through an electrically conductive stripping tape.

BACKGROUND OF THE INVENTION

In the production of semiconductor wafers, there are steps, such as a back-grinding step, in which semiconductor wafers are processed while their circuit pattern side is covered with a protective sheet applied thereto. In the back-grinding step, the semiconductor wafers which have undergone the step of forming a circuit pattern, e.g., an IC pattern, are ground or polished reduce their thicknesses to as thin as possible. For example, semiconductor wafers having a thickness of about 0.6 mm are ground to around 0.3 to 0.4 mm. The protective sheet in this step serves to prevent the semiconductor wafer from being broken and to prevent the circuit pattern side from being fouled or damaged by grinding dust or other substances. As illustrated in FIG. 1, an exemplary protective sheet comprises a substrate sheet 12 made of a plastic film and a pressure-sensitive adhesive layer 13 formed thereon. Due to such construction, static electricity is apt to be generate and the protective sheet is apt to be electrostatically charged when the protective sheet is handled, such as when a separator 2 covering and protecting the pressure-sensitive adhesive layer 13 is peeled away or when the resulting protective sheet is applied to the circuit pattern side of a semiconductor wafer. Since the static charge accumulated on the protective sheet is discharged when the protective sheet is applied to a semiconductor wafer, sometimes resulting in breakage of the circuit pattern, some measures are being taken to prevent static buildup by imparting electrical conductivity to protective sheets by providing them with an antistatic layer 11, incorporating an electrically conductive powder, or by other suitable means.

When the protective sheet on a semiconductor wafer becomes unnecessary, it is stripped and removed from the circuit pattern side. This stripping also generates static electricity as in the above-described cases.

For this reason, the conventional method in which a worker strips off protective sheets directly by hand is problematic besides the poor working efficiency, the stripping of protective sheets may cause circuit breakage even if the protective sheets are electrically conductive because the static charges accumulated on the worker are also discharged.

SUMMARY OF THE INVENTION

An object of the present invention is to provide a method of stripping off a wafer-protective sheet in which a wafer-protective sheet is stripped off by means of an automatic stripping system without causing circuit breakage ascribable to static electricity. In particular, the present invention provides a method of stripping off a wafer-protective sheet in which the amount of the static electricity generated is 500 V or less.

The above objects of the present invention can be accomplished by a method in which an electrically conductive protective sheet applied to a semiconductor wafer is stripped off while it is kept grounded so that generated static electricity is discharged immediately, which is attained by an electrically connectable combination of the electrically conductive protective sheet and an electrically conductive stripping tape.

Accordingly, the present invention provides a method of stripping off a wafer-protective sheet which comprises bonding an electrically conductive continuous-form stripping tape comprising a flexible substrate to, through a pressuresensitive adhesive layer, an electrically conductive protective sheet applied to a semiconductor wafer on its side where a circuit pattern has been formed, and then peeling the stripping tape from the semiconductor wafer to thereby strip the protective sheet from the semiconductor wafer, the bonding and peeling of the stripping tape being conducted automatically by means of an automatic stripping system while the protective sheet is kept being grounded through the stripping tape.

According to the method of the present invention, in which a protective sheet applied to the circuit pattern side of a semiconductor wafer is automatically stripped off together with a continuous-form stripping tape bonded to the protective sheet, a static electricity-discharging system can be established by imparting electrical conductivity to both of the protective sheet and the stripping tape to thereby electrically connect the sheet and the tape with each other and by grounding the electrically conductive stripping tape. Due to the discharge system, the generation of static electricity during the automatic stripping of the protective sheet by means of an automatic stripping system can be prevented or reduced and, hence, circuit breakage can be avoided.

DETAILED DESCRIPTION OF THE INVENTION

Figure 1:
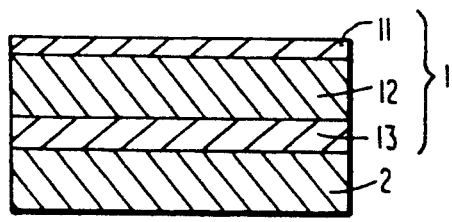
FIG. 1 is a sectional view of one embodiment of the protective sheet stripped off in the method of the present invention.
Figure 2:
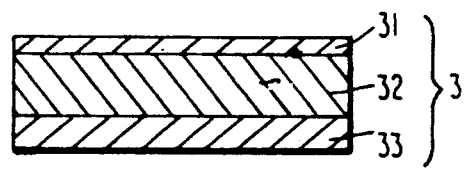
FIG. 2 is a sectional view of one embodiment of the stripping tape used in the method of the present invention.

The stripping tape 3 used in the method of the present invention, an example of which is shown in FIG. 2, comprises a flexible substrate, has electrical conductivity, and is in continuous form. Besides being prepared using a metallic tape as a flexible substrate, the stripping tape can be prepared in the same manner as the methods of producing a protective sheet. For example, it may be prepared by a method in which a conductive layer 31 comprising, for example, a thin layer of an electrically conductive substance such as a metal or metal oxide, or a coating layer containing an antistatic agent is formed on one or both sides of a flexible substrate 32 comprising a plastic film; or a method in which an electrically conductive substance or an antistatic agent is incorporated into a flexible substrate or a pressure-sensitive adhesive layer. It is preferred that the stripping tape has a surface resistivity of 10 Ω/□ or less. It is also preferable that in the case where the stripping system is controlled with the aid of a sensing system employing a sensor or the like, the stripping tape is transparent.

An advantageously used example of the stripping tape is be which has a conductive layer comprising a thin layer of an electrically conductive substance formed by vapor deposition or sputtering. Such stripping tape is less apt to release free ions, and its surface resistivity changes little with changing humidity, so that the stripping tape shows a stable antistatic effect, i.e., the stripping tape is very effective in preventing the generation of static electricity. Such a stripping tape also has excellent flexibility and, hence, has good applicability to protective sheets and has an advantage of being able to be peeled in various directions when the protective sheet is stripped from the circuit pattern side of a semiconductor wafer.

The flexible substrate preferably is a plastic film having excellent water resistance. In general, a film comprising polyethylene, polypropylene, a polyester, a polycarbonate, an ethylene-vinyl acetate copolymer, an ethylene-ethyl acrylate copolymer, an ethylene-propylene copolymer, poly(vinyl chloride), or the like and having a thickness of from 10 to 500 μm, preferably from 25 to 200 μm, can be used.

Figure 3:
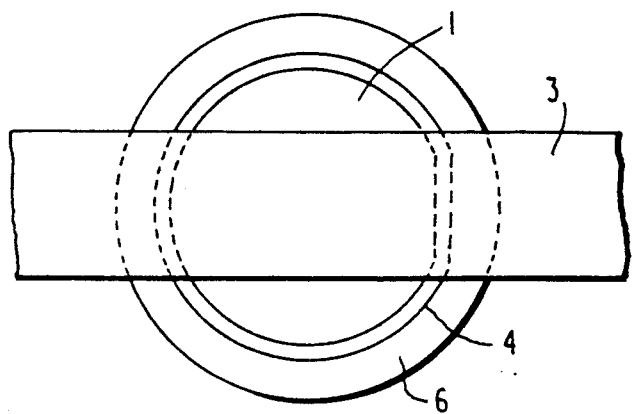
FIG. 3 is a plan view showing one embodiment of the bonded state of the protective sheet and the stripping tape.
Figure 4:
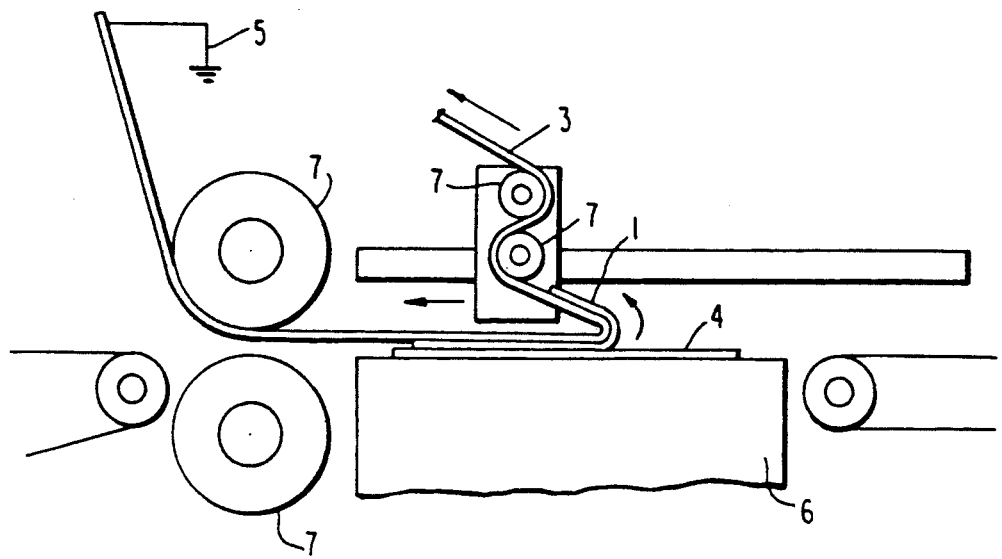
FIG. 4 is a view showing one embodiment of the automatic stripping system used in the present invention.

As shown in FIG. 3 and FIG. 4, the stripping tape 3 in the method of the present invention is bonded to the back (11) of a protective sheet 1 through a pressure-sensitive adhesive layer 33. The pressure-sensitive adhesive layer 33 generally is formed beforehand on the stripping tape 3, although this is not requisite. The pressure-sensitive adhesive layer 33 is formed such that the adhesion strength between the pressuresensitive adhesive layer 33 and the protective sheet 1 is higher than the adhesion strength between the protective sheet 1 and the circuit pattern side of the semiconductor wafer. Owing to this, the protective sheet 1 applied to the circuit pattern side through a pressure-sensitive adhesive layer 13 can be stripped therefrom by peeling the stripping tape 3 bonded to the protective sheet 1. The pressure-sensitive adhesive used is not particularly limited in kind, and in general, a pressure-sensitive adhesive of a rubber type or acrylic type or other type can be employed.

One embodiment of the stripping method of the present invention is shown in FIG. 4. The method of the present invention is characterized in that a stripping tape 3 is bonded to a protective sheet 1 applied to the circuit pattern side of a semiconductor wafer 4 and the protective sheet 1 is then automatically stripped off by peeling the stripping tape 3 by means of an automatic stripping system, and that these treatments are conducted while the protective sheet 1 is kept in a grounded state 5 through the stripping tape 3. In practicing the present invention, each of the bonding, stripping, grounding, etc., can be conducted in a suitable manner. Further, it is possible to bond one stripping tape to two or more protective sheets simultaneously or successively.

In the method shown in FIG. 4, a stripping tape 3 is bonded to the back of a protective sheet 1 applied to the circuit pattern side of a semiconductor wafer 4 which has undergone predetermined treatments. Subsequently, while the semiconductor wafer 4 is kept being fixed to the top of a fixing table 6 by suction or other means, the stripping tape 3 is peeled (in the direction indicated by arrows) by means of guide rolls 7 thereby to automatically strip the protective sheet 1 from the semiconductor wafer 4. In this system, the thus-stripped protective sheets 1 are collected through the stripping tape 3 orderly and successively in an automatic manner.

As described above, according to the stripping method of the present invention for stripping a protective sheet from a semiconductor wafer, the generation of static electricity during the stripping of the protective sheet can be prevented or reduced and the circuit pattern formed on the semiconductor wafer can be prevented from being broken by static electricity or electrostatic charges, because the protective sheet is stripped off while being kept grounded through the stripping tape. Furthermore, since the stripping is carried out automatically with reliability by means of an automatic stripping system. The method of the present invention attains excellent stripping efficiency, and the protective sheets stripped off can be collected through the stripping tape orderly and automatically, thus also attaining excellent collecting efficiency.

The present invention will be explained below in more detail by reference to the following examples, which should not be construed as limiting the scope of the invention.

EXAMPLE

A protective sheet comprising a 100 μm-thick ethylenevinyl acetate copolymer film having on one side thereof a 0.2 μm-thick conductive layer made of an antistatic material containing an electrically conductive polymer as a major component and further having a 20 μm-thick acrylic pressure-sensitive adhesive layer on the other side was applied to the circuit pattern side of a semiconductor wafer having a diameter of 4 inches and a thickness of 0.6 mm by means of wafer-protective sheet-automatically applying machine D-304, manufactured by Nitto Denko Corporation. The back of this semiconductor wafer was ground in an ordinary way to reduce the thickness to 0.3 mm.

Subsequently, a stripping tape composed of a 75 μm-thick polyester film on which aluminum had been vapor-deposited at a thickness of 500 Å and a 30 μm-thick rubber-type pressure-sensitive adhesive layer formed on one side of the polyester film was bonded through the rubber-type pressure-sensitive adhesive layer to the protective sheet on the ground semiconductor wafer, and the protective sheet was then stripped off automatically by means of wafer-protective sheet-automatically stripping machine H-304, manufactured by Nitto Denko Corporation which had been designed for practicing the method shown in FIG. 4. During the above procedure, the stripping tape was kept being grounded through a wind-up machine therefor.

The adhesion strengths of the protective sheet and stripping tape used above were as follows. The adhesion strength of the protective sheet to a stainless-steel (SUS 304) plate (20° C., 65% RH, 180° peeling, pulling speed 300 mm/min) was 100 g/20 mm, while that of the stripping tape was 1,000 g/20 mm under the same conditions. The surface resistivity of the stripping tape was $10^8$ Ω/□.

COMPARATIVE EXAMPLE

A protective sheet was applied and stripped off in the same manner as in the above Example except that a polyester film which had no vapor-deposited aluminum layer and was hence electrically non-conductive was employed as the flexible substrate of the stripping tape used.

EVALUATION TEST

In the above Example and Comparative Example, the amount of the static electricity generated when the protective sheet was stripped off was measured. The results obtained are shown below.

|  | Amount of static electricity (V) |
| --- | --- |
| Example | 100 or less |
| Comparative Example | 1,000 |

Circuit pattern breakage due to static electricity did not occur in the Example, whereas it occurred in the Comparative Example.

While the invention has been described in detail and with reference to specific embodiments thereof, it will be apparent to one skilled in the art that various changes and modifications can be made therein without departing from the spirit and scope thereof.

What is claimed is:

1. A method of stripping off a wafer protective sheet comprising:
    (1) bonding with a pressure-sensitive adhesive layer (a) an electrically conductive protective sheet applied to a semiconductor wafer on its side where a circuit pattern has been formed, and (b) an electrically conductive continuous-form stripping tape comprising a flexible substrate and a conductive layer; and
    (2) peeling the stripping tape from the semiconductor wafer;
wherein said bonding and peeling of the stripping tape is conducted automatically by means of an automatic stripping system while the protective sheet is kept grounded through the stripping tape.

2. A method of stripping off a wafer protective sheet comprising:
    (1) bonding with a pressure-sensitive adhesive layer (a) an electrically conductive protective sheet applied to a semiconductor wafer on its side where a circuit pattern has been formed, and (b) an electrically conductive continuous-form stripping tape comprising a flexible substrate and a conductive layer; and
    (2) peeling the stripping tape from the semiconductor wafer;
wherein said bonding and peeling of the stripping tape is conducted automatically by means of an automatic stripping system while the protective sheet is kept grounded through the stripping tape and wherein the amount of static electricity generated is 500 V or less.

3. A method of stripping off a wafer protective sheet comprising:
    (1) bonding with a pressure-sensitive adhesive layer (a) an electrically conductive protective sheet applied to a semiconductor wafer on its side where a circuit pattern has been formed and (b) an electrically conductive continuous-form stripping tape comprising a flexible substrate and a conductive layer; and
    (2) peeling the stripping tape from the semiconductor wafer;
wherein said bonding and peeling of the stripping tape is conducted automatically by means of an automatic stripping system while the protective sheet is kept grounded through the stripping tape and wherein both the stripping tape and the protective sheet have a surface resistivity of $10^{12}$ $\Omega/\square$ or less.

4. A method of stripping off a wafer protective sheet comprising:
    (1) bonding with a pressure-sensitive adhesive layer (a) an electrically conductive protective sheet applied to a semiconductor wafer on its side where a circuit pattern has been formed, and (b) an electrically conductive continuous-form stripping tape comprising a flexible substrate and a conductive layer; and
    (2) peeling the stripping tape from the semiconductor wafer;
wherein said bonding and peeling of the stripping tape is conducted automatically by means of an automatic stripping system while the protective sheet is kept grounded through the stripping tape and wherein said pressure-sensitive adhesive layer has greater adhesive strength than the adhesive strength between said protective sheet and said semiconductor wafer.

* * * * *